United States Patent
Mosca et al.

(10) Patent No.: US 10,650,178 B2
(45) Date of Patent: May 12, 2020

(54) DECODING-BASED METHOD FOR QUANTUM CIRCUIT OPTIMIZATION

(71) Applicant: Michele Mosca, Waterloo (CA)

(72) Inventors: Michele Mosca, Waterloo (CA);
Matthew Edward Joseph Amy, Toronto (CA)

(73) Assignee: Michele Mosca, Waterloo (CA)

(*) Notice: Subject to any disclaimer, the term of this patent is extended or adjusted under 35 U.S.C. 154(b) by 121 days.

(21) Appl. No.: 16/070,309

(22) PCT Filed: Jan. 25, 2017

(86) PCT No.: PCT/CA2017/050076
§ 371 (c)(1),
(2) Date: Jul. 16, 2018

(87) PCT Pub. No.: WO2017/127923
PCT Pub. Date: Aug. 3, 2017

(65) Prior Publication Data
US 2019/0018912 A1    Jan. 17, 2019

Related U.S. Application Data

(60) Provisional application No. 62/287,183, filed on Jan. 26, 2016.

(51) Int. Cl.
*G06F 17/50*    (2006.01)
*G06N 10/00*    (2019.01)
(Continued)

(52) U.S. Cl.
CPC ............ *G06F 30/327* (2020.01); *B82Y 10/00* (2013.01); *G06F 30/30* (2020.01); *G06F 30/337* (2020.01);
(Continued)

(58) Field of Classification Search
None
See application file for complete search history.

(56) References Cited

U.S. PATENT DOCUMENTS 7,655,850 B1    2/2010 Ahn
9,269,052 B2*   2/2016 Svore .................... G06N 10/00
(Continued)

FOREIGN PATENT DOCUMENTS

WO    2003081526    10/2003
WO    2015157049    10/2015
WO    2016040708    3/2016

OTHER PUBLICATIONS

P.W. Shor, "Algorithms for Quantum Computation: Discrete Logarithms and Factoring," 1994 IEEE, pp. 124-134. (Year: 1994).*
(Continued)

*Primary Examiner* — Leigh M Garbowski
(74) *Attorney, Agent, or Firm* — CPST Intellectual Property; Brett J. Slaney (57) ABSTRACT

Quantum circuits include quantum gates that require a certain amount of physical resources. It is desirable to reduce the number of certain quantum gates in order to improve the hardware efficiency of a quantum circuit. A system and a method are provided for synthesizing a quantum circuit that includes the operations of determining an ordered set or vector of phase coefficients and specifying a linear permutation. The operations also include determining a sequence of CNOT and Rz gates using the set of phase coefficients and the linear permutation, such that the number of Rz gates is reduced.

11 Claims, 5 Drawing Sheets

(51) Int. Cl.

| | |
|---|---|
| *G06F 30/327* | (2020.01) |
| *B82Y 10/00* | (2011.01) |
| *G06N 99/00* | (2019.01) |
| *G06F 30/30* | (2020.01) |
| *G06F 30/337* | (2020.01) |
| *G06F 30/373* | (2020.01) |
| *G06F 30/398* | (2020.01) |
| *B82Y 40/00* | (2011.01) |
| *G06F 17/16* | (2006.01) |

(52) U.S. Cl.
CPC .......... *G06F 30/373* (2020.01); *G06N 10/00* (2019.01); *G06N 99/00* (2013.01); *B82Y 40/00* (2013.01); *G06F 17/16* (2013.01); *G06F 30/398* (2020.01)

(56) References Cited

U.S. PATENT DOCUMENTS

| | | | |
|---|---|---|---|
| 9,514,415 B2* | 12/2016 | Bocharov | G06N 10/00 |
| 9,633,313 B2* | 4/2017 | Svore | G06N 10/00 |
| 2006/0123363 A1 | 6/2006 | Williams et al. | |
| 2014/0280427 A1 | 8/2014 | Bocharaov et al. | |
| 2014/0280404 A1 | 9/2014 | Svore et al. | |

OTHER PUBLICATIONS

X. Zhou et al., "Methodology for quantum logic gate construction," The American Physical Society, 2000, Physical Review A, vol. 62, 12 pages. (Year: 2000).*

M. Amy et al., "A Meet-in-the-Middle Algorithm for Fast Synthesis of Depth-Optimal Quantum Circuits," IEEE Trans. on Computer-Aided Design of Integrated Circuits and Systems, vol. 32, No. 6, Jun. 2013, pp. 818-830. (Year: 2013).*

A.J. Landahl et al., "Complex instruction set computing architecture for performing accurate quantum Z rotations with less magic," arXiv: 1302.3240 [quant-ph], Cornell University, Oct. 2013, 3 pages. (Year: 2013).*

International Search Report issued in corresponding PCT Application No. PCT/CA2017/050076; dated May 11, 2017.

M. Amy, D. Maslov, M. Mosca, "Polynomial-time T-depth Optimization of Clifford+T circuits via Matroid Partitioning," IEEE Transactions on Computer-Aided Design of Integrated Circuits and Systems, vol. 33, No. 10, pp. 1476-1489, 2014.

D. E. Muller, "Application of Boolean algebra to switching circuit design and to error detection," Transactions on the I.R.E. Professional Group on Electronic Computers, vol. EC-3, No. 3, pp. 6-12, 1954.

I. Reed, "A class of multiple-error-correcting codes and the decoding scheme," Transactions on the I.R.E. Professional Group on Information Theory, vol. 4, No. 4, pp. 38-49, 1954.

* cited by examiner

Example

Example

FIG. 3

Example

DECODING-BASED METHOD FOR QUANTUM CIRCUIT OPTIMIZATION

CROSS-REFERENCE TO RELATED APPLICATIONS

The present application claims priority to U.S. Patent Application No. 62/287,183, titled "Decoding-Based System and Method for Quantum Circuit Optimization", and filed on Jan. 26, 2016, the entire contents of which are hereby incorporated by reference.

FIELD OF INVENTION

The present invention relates to quantum computing and, in particular, to optimizing quantum circuits over a standard set of gates with respect to gate counts.

BACKGROUND

Traditional digital computers use arrays of transistors to perform operations over binary data—that is, series of bits which have two possible values: "on" and "off", "high" and "low", 0 and 1, etc. Massive advancements in this technology have been made over the past century, to the point where a computer that fits in one's pocket can outperform computers that previously spanned multiple rooms. This is due in large part to the shrinking of the transistor and the continuously compressing more transistors onto smaller chips. However, certain physical laws restrict this process from repeating indefinitely and as such the speed of digital computers will eventually reach a plateau. Hence researchers have been looking to other types of computation as ways of progressing beyond this bound.

Quantum computers, first devised in 1982 by Richard Feynman, use the principles of quantum mechanics to perform computations. These computational devices can exploit, for example, phenomena such as "quantum parallelism" whereby computations are, in effect, performed on an exponential number of input states simultaneously. In fact, algorithms have been devised exploiting such effects to theoretically out-perform best known classical algorithms—for example, Shor's algorithm provides an exponential speed-up over the best known classical algorithm for factoring numbers.

These theoretical benefits are subject to certain "crossover points," the instance size after which a quantum algorithm begins to outperform a classical one. The crossover points are influenced by a variety of factors, including the cost of the implementation of the algorithm in the form of a quantum circuit. To reduce the crossover points, at which point the overhead of performing quantum computation is less than the theoretical speedup, it is therefore an object of research to develop methods by which the cost of quantum circuits may be reduced, a process which is referred to as circuit optimization.

SUMMARY

The invention accordingly comprises methods and systems for synthesizing quantum circuits over a particular set of gates, and for the reduction, or optimization, of the number of gates in a quantum circuit already expressed over the aforementioned set of gates. The methods and systems utilize decoders for a specific family of linear codes to minimize the circuit cost of an integer-valued vector which represents in a precise fashion the quantum operation being synthesized. An equivalent circuit is then synthesized using the cost-minimized vector. Moreover, the vector has cost lesser or equal to the cost of the input circuit.

Neither this section nor the sections which follow are intended to either limit the scope of the claims which follow or define the scope of those claims.

BRIEF DESCRIPTION OF THE DRAWINGS

The details and features of the invention will become more apparent in the following description which references the appended drawings.

The details and features of the invention will become more apparent in the following description which references the appended drawings.

DETAILED DESCRIPTION

The description of the present invention is divided into two sections. The first of which comprises a brief description of the quantum circuit model in which we describe our invention. A reader who is familiar with quantum circuits may wish to proceed directly to the latter section.

Overview of Quantum Circuits

A basic unit of information in a quantum computer is called a quantum bit (qubit), the quantum analog of a bit. Qubits may be described mathematically as having a state given by a vector in the 2 dimensional complex vector space $\mathbb{C}^2$. The two vectors of the standard basis are denoted by $$|0\rangle = \begin{bmatrix}1\\0\end{bmatrix} \text{ and } |1\rangle = \begin{bmatrix}0\\1\end{bmatrix},$$

and represent the classical binary values 0 and 1 respectively. The state of a qubit is then effectively a complex-valued combination (sum) of the 0 and 1 states $\alpha|0\rangle + \beta|1\rangle$, where $\alpha$ and $\beta$ are complex numbers. This is the principle of superposition which allows quantum computers to perform operations on many different inputs, in a sense, simultaneously.

When multiple qubits are used within a quantum computation their states may become entangled, meaning it may not be possible to describe the state of each qubit independently from the entire system. Generally, the state of a system of n-qubits is given as a vector in the $2^n$-dimensional complex vector space $\mathbb{C}^{2^n}$, with the standard basis vectors denoted $|x_1 x_2 \ldots x_n\rangle$ for all n-bit strings $x_1 x_2 \ldots x_n \in \{0,1\}^n$. Again, the state $|\psi\rangle$ of a system of n qubits may be effectively viewed as a complex-valued combination of n-bit strings:

$$|\psi\rangle = \sum_{x_1 x_2 \ldots x_n \in \{0,1\}^n} \alpha_{x_1 x_2 \ldots x_n} |x_1 x_2 \ldots x_n\rangle = \begin{bmatrix} \alpha_{00\ldots 0} \\ \alpha_{10\ldots 0} \\ \vdots \\ \alpha_{11\ldots 1} \end{bmatrix}$$

Basic quantum operations are unitary operators on the state space of a system of qubits. Specifically, a unitary operator on n qubits is a $2^n$ by $2^n$ complex-valued matrix U which has inverse equal to its conjugate-transpose, denoted $U^\dagger$. The conjugate transpose of U is obtained by a transposition of its rows and columns, and then replacing each entry with its complex conjugate. Applying an n-qubit unitary U to an n-qubit quantum state vector $|\psi\rangle$ results in the state given by the regular matrix-vector multiplication $U|\psi\rangle$. Unitaries acting on different qubits in a system are combined into a unitary on the entire system by taking their tensor product denoted by $\otimes$. For instance, $$\begin{bmatrix} 1 & 0 \\ 0 & 1 \end{bmatrix} \otimes U = \begin{bmatrix} U & 0 \\ 0 & U \end{bmatrix}.$$

Other quantum operations, such as measurement of a qubit with respect to a basis, are also possible.

Figure 1:
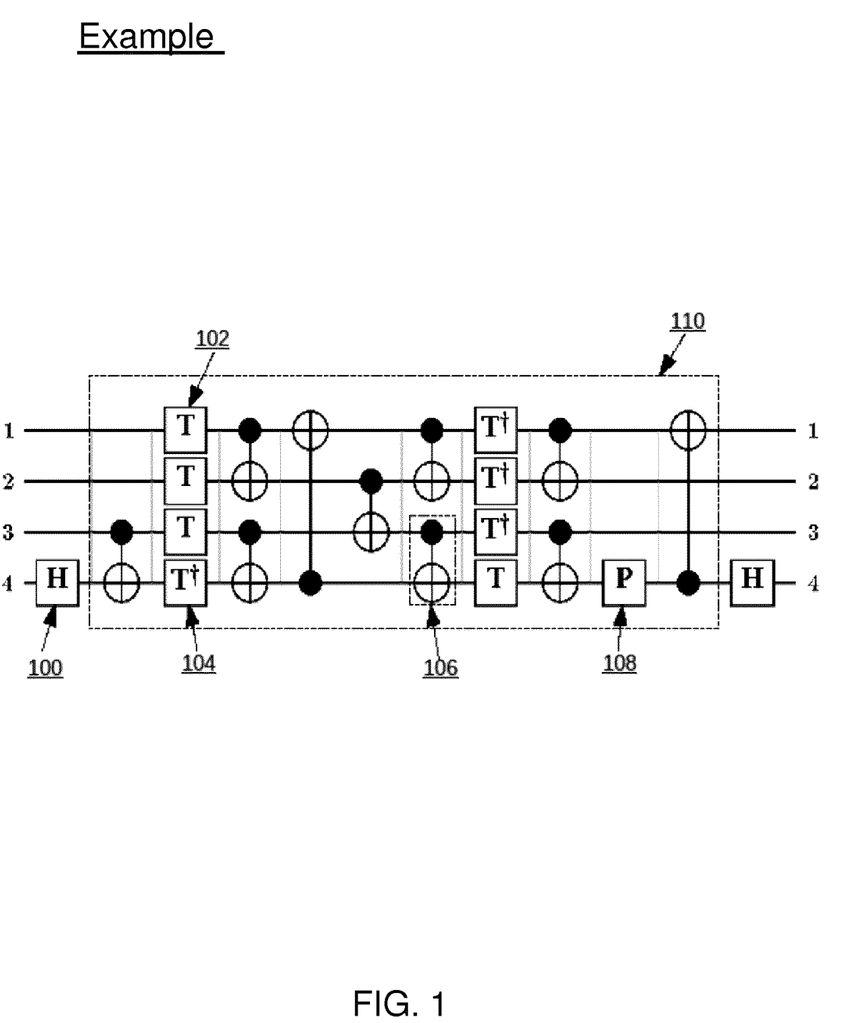
FIG. 1 is an example of a quantum circuit over CNOT, T, T†, P, and H gates.

Quantum circuits are an analog of classical circuits which are used to describe quantum computations in terms of smaller quantum operations. In a quantum circuit, wires carry qubits to gates, which transform their state according to some unitary matrix. Quantum circuits are typically displayed as a graph with horizontal lines representing qubits and labeled boxes representing the application of gates to sets of qubits. As a convention quantum circuits are run from left to right. FIG. 1 gives one such example of a graphical representation of a quantum circuit. 100, 102, 104, 106 and 108 are all quantum gates, while the boxed area 110 is a subcircuit of the entire circuit. 106 represents the two-qubit controlled-NOT gate, also called a CNOT gate, defined as $$CNOT = \begin{bmatrix} 1 & 0 & 0 & 0 \\ 0 & 1 & 0 & 0 \\ 0 & 0 & 0 & 1 \\ 0 & 0 & 1 & 0 \end{bmatrix}.$$

The other gates shown are defined below.

$$H = \begin{bmatrix} \frac{1}{\sqrt{2}} & \frac{1}{\sqrt{2}} \\ \frac{1}{\sqrt{2}} & \frac{-1}{\sqrt{2}} \end{bmatrix}, T = \begin{bmatrix} 1 & 0 \\ 0 & e^{i\pi/4} \end{bmatrix}, P = T^2, T^\dagger = T^{-1} = T^7.$$

Given a particular, possibly infinite, set of gates $\mathcal{G} = \{G_1, G_2, \ldots\}$, a circuit over $\mathcal{G}$ is a quantum circuit in which only the gates found in $\mathcal{G}$ are used. Such a set of gates is referred to as a gate set or basis.

Quantum circuits may also include other features such as measurements or classical control; such features are irrelevant to this application and are not described, but it is appreciated that the present invention applies to quantum circuits which may make use of such features. Additionally, while quantum circuits and computation are described here in the language of mathematics, it is understood that these function as a formalism for physical computations that are performed on a quantum computer, and that the object of invention applies to these physical computations. For example, a quantum circuit represented in some format, either as a drawing or in a suitable binary format may be mapped, by hand or by an automated tool, into a sequence of individual instructions for a quantum computer. In this way, the object of invention applies to the efficient operation of physical quantum computing hardware.

Methods and Systems Disclosed in the Current Application

The present invention is directed to methods and systems of optimization circuits over the two qubit CNOT gate and the infinite family of one qubit gates $R_Z(\pi/k)$ for integers k, defined as $$R_Z(\pi/k) = \begin{bmatrix} 1 & 0 \\ 0 & e^{\frac{2\pi i}{k}} \end{bmatrix}.$$

It is understood that by "$R_Z$ gates" or "phase gates" we mean $R_Z(\pi/k)$ for any integer value of k greater than 0.

Due to the linearity of quantum mechanics, it is known that these quantum gates may be alternately expressed as injections from the vectors of the standard basis of $\mathbb{C}^{2^n}$ into the complex vector space. Using the previously detailed association of each vector in the standard basis with a string of n bits $|x_1 x_2 \ldots x_n\rangle$, such an injection may be written as a function taking a bit string and returning a complex sum of bit strings. In particular, we have the following definitions:

$$CNOT: |xy\rangle \mapsto |x(x \oplus y)\rangle, R_Z(\pi/k): |x\rangle \mapsto e^{\frac{2\pi i}{k}x}|x\rangle.$$

In general any quantum circuit may be expressed as an operator in this form, hereafter referred to as the SOP (sum-over-paths) form of a quantum circuit.

Prior research has shown [1] that quantum circuits over the basis consisting of CNOT and $T = R_Z(\pi/8)$, $P = R_Z(\pi/4)$ and $Z = R_Z(\pi/2)$ have SOP form $$|x_1 x_2 \ldots x_n\rangle \mapsto e^{\frac{2\pi i}{8} p(x_1, x_2, \ldots, x_n)} |f(x_1, x_2, \ldots, x_n)\rangle \quad (1)$$

where $p(x_1, x_2, \ldots, x_n)$ is some integer-valued function which is expressible as a sum of XORs of $x_1, x_2, \ldots, x_n$ with integer coefficients, and f is function from length n bitstrings to length n bitstrings that is linear with respect to binary addition (XOR). In particular, $$p(x_1, x_2, \ldots, x_n) = \Sigma_{i=1}^{2^n - 1} a_i \cdot (x_1(i)_1 \oplus x_2(i)_2 \oplus \ldots \oplus x_n(i)_n)$$

where $(i)_j$ is the jth digit in the binary expansion of i and $\oplus$ is addition mod 2. The coefficients $\{a_i\}$ are referred to as the phase coefficients. In general quantum circuits over the basis containing CNOT and $R_Z$ gates have SOP form $$|x_1 x_2 \ldots x_n\rangle \mapsto e^{\frac{2\pi i}{d} p(x_1, x_2, \ldots, x_n)} |f(x_1, x_2, \ldots, x_n)\rangle \quad (2)$$

for some integer d, where p and f are as described above.

The publication [1] gives a method of synthesizing a canonical quantum circuit over the CNOT, T, P and Z gate basis from an SOP description of form Equation 1. This method can be shown to produce circuits that have a number of T, P, and Z gates given by the number of coefficients in P that are odd modulo 8, 4, and 2, respectively. Moreover, it can be used to optimize circuits, as a circuit written over CNOT, T, P, and Z gates may have its SOP form computed, then a circuit is re-synthesized from its SOP form, with the additional property that the SOP form results in fewer T gates when re-synthesized. This method can be modified to synthesize circuits with the more general SOP form of Equation 2.

It follows mathematically that since $e^{2\pi i}=1$, whenever $$p(x_1,x_2,\ldots,x_n)=p'(x_1,x_2,\ldots,x_n) \bmod d$$

for every $x_1, x_2, \ldots, x_n \in \{0, 1\}$ it is the case that $$e^{\frac{2\pi i}{d}p(x_1,x_2,\ldots,x_n)} = e^{\frac{2\pi i}{d}p'(x_1,x_2,\ldots,x_n)}.$$

Hence the two quantum operations
and $$|x_1 x_2 \ldots x_n\rangle \mapsto e^{\frac{2\pi i}{d}p(x_1,x_2,\ldots,x_n)}|f(x_1, x_2, \ldots, x_n)\rangle$$

$$|x_1 x_2 \ldots x_n\rangle \mapsto e^{\frac{2\pi i}{d}p'(x_1,x_2,\ldots,x_n)}|f(x_1, x_2, \ldots, x_n)\rangle$$

are one and the same.

It is then a possibility for optimization to, given a particular phase function, find one that results in an equivalent quantum operation at lower cost. If the coefficients of the phase function $$p(x_1, x_2, \ldots, x_n) = \sum_{i=1}^{2^n-1} \alpha_i \cdot (x_1(i)_1 \oplus x_2(i)_2 \oplus \ldots \oplus x_n(i)_n)$$

are written as an ordered set or vector $a=(a_1, a_2, \ldots, a_n)$, then it follows that the vector of coefficients a' of p' above have the following relation a'=a+c where addition between vectors is pointwise and $$\sum_{i=1}^{2^n-1} c_i \cdot (x_1(i)_1 \oplus x_2(i)_2 \oplus \ldots \oplus x_n(i)_n) = 0$$

for all $x_1, x_2, \ldots, x_n \in \{0, 1\}$. We define the set of all such vectors c for particular values of n and d to be the set C(n,d). The set C(n,d) is in fact a linear integer code. Hence given a vector of $2^n-1$ coefficients a defining the function $p(x_1, x_2, \ldots, x_n)$ finding some coefficients a' so that $p'(x_1, x_2, \ldots, x_n) = p(x_1, x_2, \ldots, x_n) \bmod d$ and a' has minimal circuit cost may be framed as a decoding problem where a is decoded as c in C(n,d) minimizing the circuit cost of a+c. It will be appreciated that a specific quantum circuit may be attributed a cost (also referred to as circuit cost), which estimates the amount of physical resources required to implement the circuit on quantum hardware. In this case, we seek to reduce or minimize the cost of certain phase gates, since they tend to require more physical resources (e.g. physical qubits and physical operations) to implement on a physical device.

Figure 2:
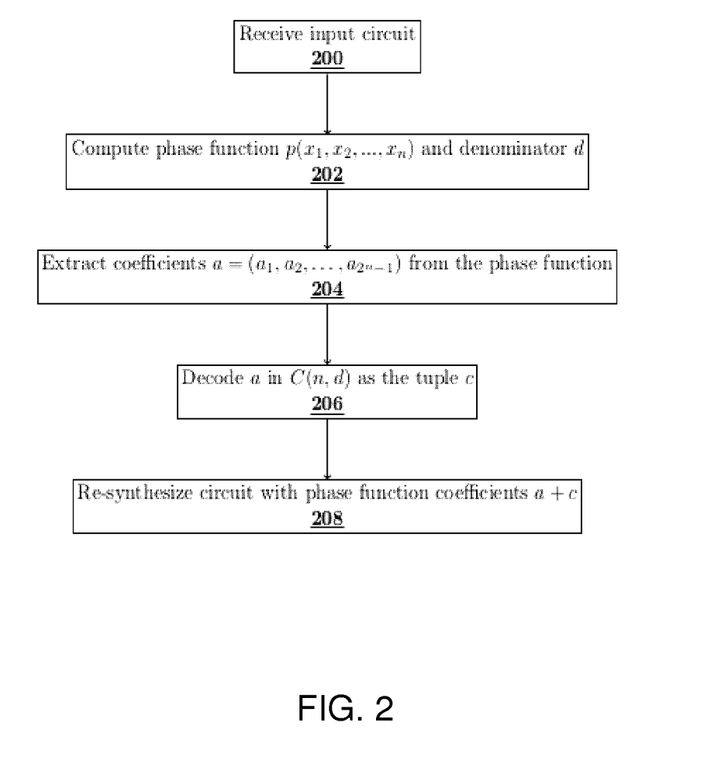
FIG. 2 is a method of quantum circuit optimization based on decoding integer tuples.

FIG. 2 depicts a method for optimizing quantum circuits expressed over the basis consisting of CNOT and $R_Z(\pi/k)$ gates for any integers k greater than 0 using the just detailed principle. First an n-qubit circuit is received as an input to the method 200. The circuit necessarily implements a unitary operator U having definition $$U: |x_1 x_2 \ldots x_n\rangle \mapsto e^{\frac{2\pi i}{d}p(x_1,x_2,\ldots,x_n)}|f(x_1, x_2, \ldots, x_n)\rangle$$

for some d, where $p(x_1, x_2, \ldots, x_n)$ may be expressed as an integer-valued sum of XORs of the binary values $x_1, x_2, \ldots, x_n$. Specifically, $$p(x_1,x_2,\ldots,x_n)=\sum_{i=1}^{2^n-1} a_i \cdot (x_1(i)_1 \oplus x_2(i)_2 \oplus \ldots \oplus x_n(i)_n) \quad (3)$$

for some integer coefficients $a=(a_1, a_2, \ldots, a_n)$.

The method next proceeds by computing the value of d and the expression of $p(x_1, x_2, \ldots, x_n)$ in the form of Equation 3 for the input circuit 202. This can be performed by a modification of the method given in [1]. The coefficients $a=(a_1, a_2, \ldots, a_{2^n-1})$ are then extracted from $p'(x_1, x_2, \ldots, x_n)$ 204. Next, the vector a is decoded as a codeword c of the linear code C(n,d) using some suitable decoding procedure 206. Finally a new circuit is synthesized for the operator $$U': |x_1 x_2 \ldots x_n\rangle \mapsto e^{\frac{2\pi i}{d}p'(x_1,x_2,\ldots,x_n)}|f(x_1, x_2, \ldots, x_n)\rangle$$

where the coefficients of $p'(x_1, x_2, \ldots, x_n)$ are given by the vector a+c 208. By the definition of C(n,d), U' is equal to U.

In an example implementation of the process described in FIG. 2, a binary computer receives a binary or digital file that represents an n-qubit circuit as the input. In an alternative embodiment, the binary computer receives a binary or digital file that includes a phase polynomial that represents a quantum operation. The quantum operation may, for example, be derived from an initial n-qubit quantum circuit. A binary computer is a computer that operates using 1s and 0s, and is used to describe current computers (e.g. server computers, desktop computers, laptops, mobile devices, etc.) and future computers that also operate in the binary fashion.

The binary computer also outputs a binary or digital file that represents the optimized circuit, as computed according to FIG. 2. In a further example embodiment, the binary or digital file that represents the optimized circuit is then transmitted to a quantum computing device, which then uses the received data to execute a quantum circuit in accordance with the digital file that represents the optimized quantum circuit.

Figure 3:
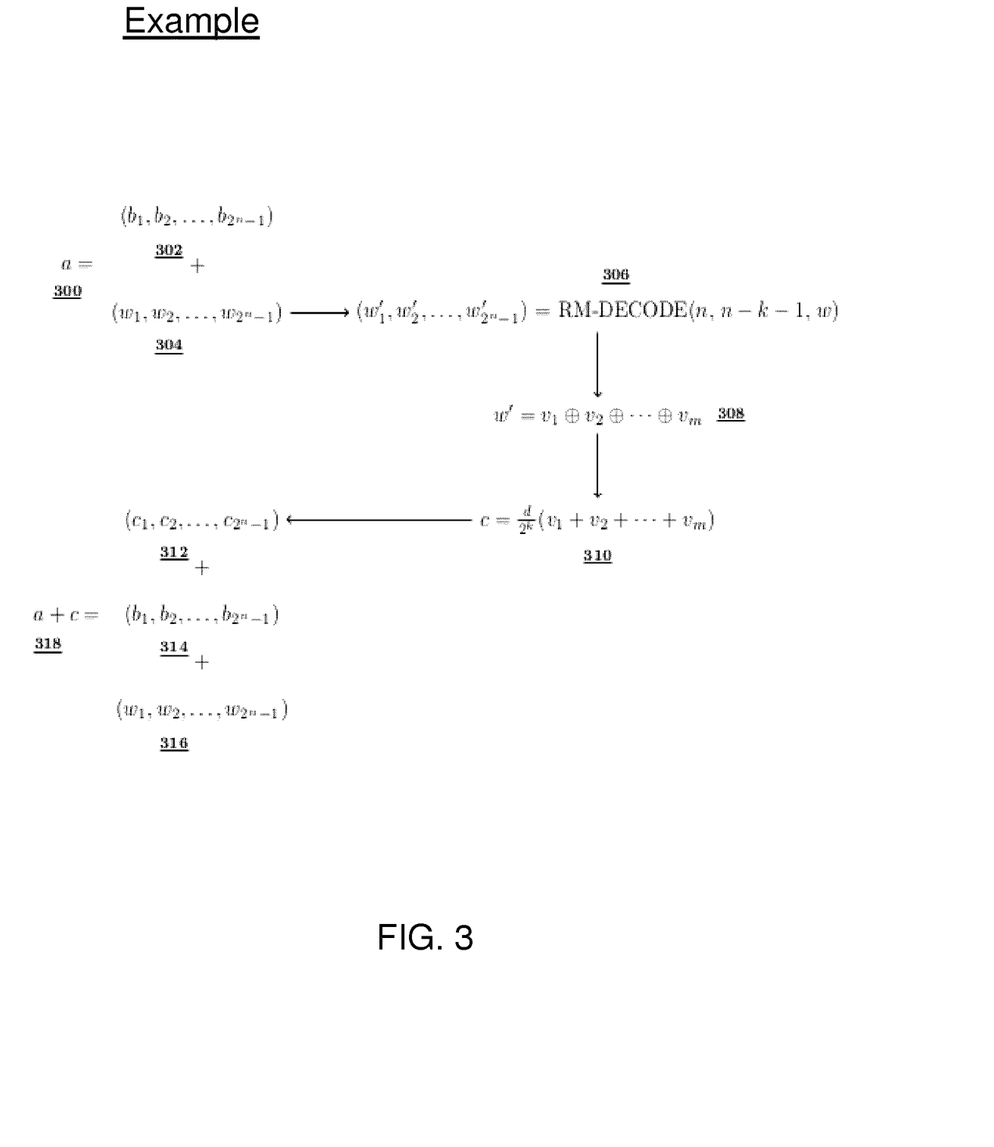
FIG. 3 is an exemplary decoding method which minimizes the rotation gates with the smallest angle.

FIG. 3 details an exemplary decoder for the code C(n,d), for use in 206. In this decoder, the received vector $a=(a_1, a_2, \ldots, a_{2^n-1})$ 300 is decomposed into its binary residue $(w_1, w_2, \ldots, w_{2^n-1})$ 304 and the remainder $$(b_1, b_2, \ldots, b_{2^n-1}) = (a_1, a_2, \ldots, a_{2^n-1}) - (w_1, w_2, \ldots, w_{2^n-1})$$

302. It is proven in the attached manuscript that the binary residue of the code C(n,d) is equal to the binary punctured Reed-Muller code of length $2^n-1$ and order n−k−1 for the greatest k such that $2^k$ divides d [2, 3]. The binary vector w is thus decoded as w' in the punctured Reed-Muller code of length $2^n-1$ and order n−k−1 306. The vector w' is further decomposed as a sum (mod 2) of binary vectors $w'=v_1 \oplus v_2 \oplus \ldots \oplus v_m$ 308, where each $v_i$ is equal to the vector of evaluations of some n-variable binary monomial of degree at most n−k−1 (see the attached manuscript). This sum is then reinterpreted as a sum over the integers mod d to compute $$c = \frac{d}{2^k}(v_1 + v_2 + \ldots + v_m)_{310}$$

which is necessarily a codeword of C(n,d). Finally c 312 is summed together with b 314 and w 316 to obtain the optimized vector a+c 318.

The decoder depicted in FIG. 3, insofar as the Reed-Muller decoder used in 306 attains minimal distance decoding, minimizes the number of $R_Z$ ($\pi/2^k$) gates in the resulting circuit. In one exemplary situation, the number of T gates in a circuit consisting of CNOT, T, $P=T^2$ and $Z=T^4$ gates may require minimization. The decoder in FIG. 3 can be used in the method of FIG. 2 to perform this minimization.

The decoder in FIG. 3 is but one exemplary decoding procedure. It is not intended to limit the scope of the decoding-based optimization method of FIG. 2.

Figure 4:
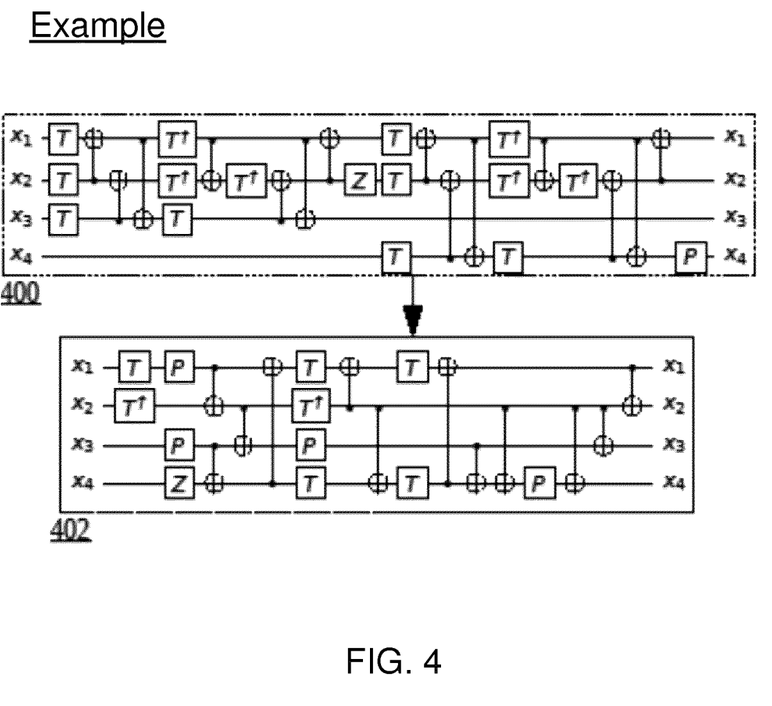
FIG. 4 shows an example quantum circuit before and after applying an embodiment of the present invention.

FIG. 4 illustrates the result of applying the circuit optimization method of FIG. 2 with decoder FIG. 3 to an exemplary (4-qubit) quantum circuit. The initial circuit 400 is input into the procedure FIG. 2 which computes a denominator of $d=2^3$ and phase function $p(x_1,x_2,x_3,x_4)=2x_1+6x_2+6(x_1 \oplus x_2)+x_3+7(x_1 \oplus x_3)+7(x_2 \oplus x_3)+(x_1 \oplus x_2 \oplus x_3)+3x_4+7(x_1 \oplus x_4)+7(x_2 \oplus x_4)+(x_1 \oplus x_2 \oplus x_4)$.

From this phase function it extracts the vector a=(2, 6, 6, 1, 7, 7, 1, 3, 7, 7, 1, 0, 0, 0, 0) of coefficients from the function, which is then decoded using the method of FIG. 3. Specifically, the binary residue w=(0, 0, 0, 1, 1, 1, 1, 1, 1, 1, 1, 0, 0, 0, 0) is decoded in the 0 order length 15 punctured Reed-Muller code resulting in the vector $w'=(1,1,1,1,1,1,1,1,1,1,1,1,1,1,1)=c$.

A new circuit 402 is then synthesized from the phase function having coefficients $a+c=(3,7,7,2,8,8,2,4,8,8,2,1,1,1,1)$.

The optimized circuit 402 contains 7 T gates, compared to the 14 T gates in the original circuit 400, and attains the exact minimal number of T gates for this quantum operation.

It is understood that the methods previously described pertain not only to the optimization of circuits consisting of only CNOT and $R_Z$ gates, but in addition to their use in optimizing subsets of circuits over a larger quantum gate set. For example, the present invention may be used to optimize quantum circuits over any gate set by applying the optimization to a relevant subcircuit. As an illustration, in one particular embodiment the circuit shown in FIG. 1 is optimized by taking the marked subcircuit 110 and applying the invention to obtain a new circuit, which is then used to replace the subcircuit 110.

Figure 5:
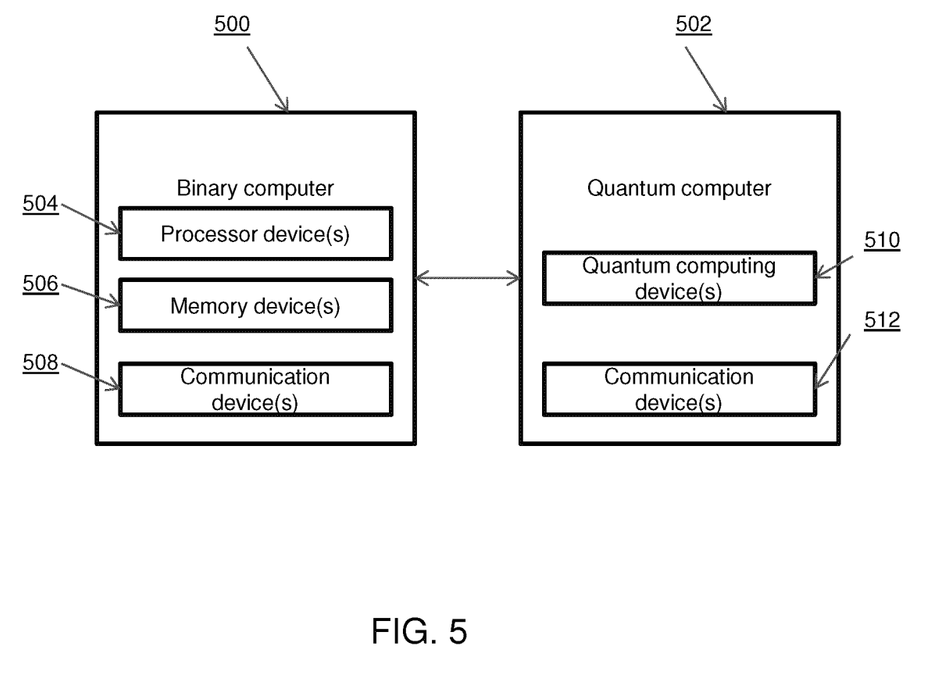
FIG. 5 is an example system for generating and executing a new quantum circuit.

In an example embodiment shown in FIG. 5, a system includes a binary computer 500 that is in data communication with a quantum computer 502. The binary computer includes one or more processor devices 504, one or memory devices 506 and one or more communication devices 508. The processor 504 and the memory 506 include currently known and future known digital technologies. The quantum computer includes one or more quantum computing devices 510 and one or more communication devices 512. In an example embodiment, the physical implementation of the quantum computing device is reconfigurable to generate different quantum circuits. It will be appreciated that currently and future known quantum computing devices that can implement different quantum circuits are applicable to the principles described herein.

Using the system of FIG. 5, an binary input representing an initial quantum circuit is received by the binary computer 500 and is stored in memory 506. By performing the computations on the binary computer via the processor(s) 504 according to the method described herein, the binary computer is able to generate and output a binary file that represents a new quantum circuit that has a lower circuit cost compared to the initial quantum circuit, but still has the same function. This binary file representing the new quantum circuit is transmitted to the quantum computer 502. The quantum computer 502 then uses the received binary file to adjust the parameters of the quantum computing devices to perform the new quantum circuit. In other words, the quantum computer executes physical CNOT and $R_Z$ transformations in accordance with the binary form of the new quantum circuit.

It should be noted that, while some of the methods and systems disclosed have been described in the abstract language of mathematics, the current application is directed towards the production of tangible, physical representations of efficient quantum circuits. For example, in one embodiment of the methods disclosed, the optimization procedure of FIG. 2 with the decoder of FIG. 3 are performed by a computer program designed to be run on a conventional computer. The input and output are circuits stored in an appropriate binary format in the physical memory—for example, a magnetic-disk (hard disk)—of the computer. Such a physical representation of a quantum circuit in an electronic storage medium may then later be used to implement the operation with a particular quantum computing technology. Examples of applicable quantum computing technology include a classical simulator for quantum computing technology or a hybrid classical/quantum devices. For example, the digital representation of the optimized circuit as a sequence of CNOT, T, P, and Z gates may be used to determine a sequence of physical pulses needed to perform the operation on a quantum computer using topological quantum error correcting codes running on superconducting qubits. Alternatively, the operations may be performed by a series of pulses and other physical operations on a quantum computer consisting of trapped ions, or spin qubits in silicon, or nitrogen vacancy qubits in diamond, or qubits encoded in topologically ordered states of matter, or other realizations and variations, including hybrid devices.

Example embodiments are described below.

In an example embodiment, a method for synthesizing a quantum circuit is provided, and it includes: determining an ordered set or vector of phase coefficients; specifying a linear permutation; and determining a sequence of CNOT and $R_Z$ gates using the set of phase coefficients and the linear permutation, such that the number of $R_Z$ gates is minimized.

In an example aspect, the method further includes: replacing said first set of phase coefficients with a second set of phase coefficients, wherein the first set of phase coefficients and the second set of phase coefficients represent the same quantum operation; and reducing the number of $R_Z$ gates required.

In another example aspect, the method further includes the use of a decoding algorithm to determine said second set of phase coefficients.

In an example aspect, a method is provided for optimizing a quantum circuit, expressed as a sequence of CNOT and $R_Z$ gates, wherein the circuit is first analyzed to obtain a set of phase coefficients and a linear permutation, and then the following operations are utilized to synthesize a new circuit: determining an ordered set or vector of phase coefficients; specifying a linear permutation; and determining a sequence of CNOT and $R_Z$ gates using the set of phase coefficients and the linear permutation, such that the number of $R_Z$ gates is minimized.

In an example aspect, a Reed-Muller decoding method is utilized to determine an alternate set of phase coefficients minimizing the number of $R_Z$ gates required.

In an example aspect, the Reed-Muller decoder is used to decode the binary residue of the set of phase coefficients, the result of which is then used to generate the alternate set of phase coefficients.

In an example aspect, the method is implemented as a computer program, wherein a processor receives a quantum circuit expressed over CNOT and $R_Z$ gates in suitable digital form, and then produces an optimized circuit in suitable digital form performing the same function.

In an example aspect, a non-transitory computer readable medium is provided for synthesizing a new quantum circuit, the non-transitory computer readable medium including thereon computer executable instructions according to the above method operations.

In an example embodiment, a computing system is provided for optimizing a quantum circuit, which includes: a memory device that stores a first digital form of an initial quantum circuit expressed as a sequence of CNOT and $R_Z$ gates; a processor device that obtains and analyzes the first digital form to determine an ordered set or vector of phase coefficients and to specify a linear permutation; the processor device determines a sequence of CNOT and $R_Z$ gates using the set of phase coefficients and the linear permutation, such that the number of $R_Z$ gates is reduced; the processor device subsequently computes a second digital form of a new quantum circuit; and the memory devices stores the second digital form.

In an example embodiment, a process of producing a quantum circuit is provided and it includes: obtaining a digital form of an initial n-qubit quantum circuit expressed over CNOT and $R_Z$ gates; a binary computer analyzing the digital form of the initial quantum circuit to obtain a set of phase coefficients and a linear permutation; the binary computer determining a sequence of CNOT and $R_Z$ gates using the set of phase coefficients and the linear permutation, and computing a digital form of a new n-qubit quantum circuit from the sequence having a reduced number of $R_Z$ gates compared to the initial quantum circuit, and the new quantum circuit performing the same function as the initial quantum circuit; and executing physical CNOT and $R_Z$ transformations in a quantum computer in accordance with the digital form of the new quantum circuit.

In an example embodiment, a system is provided for producing a quantum circuit and it includes: a binary computer in data communication with a quantum computer; and the binary computer comprising a memory device that stores a digital form of an initial n qubit quantum circuit expressed over CNOT and $R_Z$ gates. The binary computer includes a processor device to: analyze the digital form of the initial quantum circuit to obtain a set of phase coefficients and a linear permutation; determine a sequence of CNOT and $R_Z$ gates using the set of phase coefficients and the linear permutation; and compute a digital form of a new n-qubit quantum circuit from the sequence having a reduced number of $R_Z$ gates compared to the initial quantum circuit, wherein the new quantum circuit performs the same function as the initial quantum circuit. The binary computer further includes a communication device to transmit the digital form of the new quantum circuit to the quantum computer. The quantum computer includes a communication device to receive the digital form of the new quantum circuit. The quantum computer also includes devices to execute physical CNOT and $R_Z$ transformations in the quantum computer in accordance with the digital form of the new quantum circuit.

It will be appreciated that different features of the example embodiments of the system, the method and the apparatus, as described herein, may be combined with each other in different ways. In other words, different operations, devices and components may be used together according to other example embodiments, although not specifically stated.

The steps or operations in the flow diagrams described herein are just for example. There may be many variations to these steps or operations without departing from the spirit of the invention or inventions. For instance, the steps may be performed in a differing order, or steps may be added, deleted, or modified.

Although the above has been described with reference to certain specific embodiments, various modifications thereof will be apparent to those skilled in the art without departing from the scope of the claims appended hereto.

REFERENCES

[1] M. Amy, D. Maslov, M. Mosca, "Polynomial-time T-depth Optimization of Clifford+T circuits via Matroid Partitioning," *IEEE Transactions on Computer-Aided Design of Integrated Circuits and Systems*, vol. 33, no. 10, pp 1476-1489, 2014.

[2] D. E. Muller, "Application of Boolean algebra to switching circuit design and to error detection," *Transactions on the I.R.E. Professional Group on Electronic Computers*, vol EC-3, no. 3, pp. 6-12, 1954.

[3] I. Reed, "A class of multiple-error-correcting codes and the decoding scheme," *Transactions on the I.R.E. Professional Group on Information Theory*, vol 4, no. 4, pp. 38-49, 1954.

The entire contents of the above references [1], [2] and [3] are herein incorporated by reference.

The invention claimed is:

1. A method for synthesizing a quantum circuit comprising the steps of:
   a. Determining an ordered set or vector of phase coefficients,
   b. Specifying a linear permutation,
   c. Determining a sequence of CNOT and $R_Z$ gates using the set of phase coefficients and the linear permutation, such that the number of $R_Z$ gates is minimized.

2. The method of claim 1, further comprising the step of:
   a. Replacing said first set of phase coefficients with a second set of phase coefficients, wherein the first set of phase coefficients and the second set of phase coefficients represent the same quantum operation,
   b. reducing the number of $R_Z$ gates required.

3. The method of claim 2, further comprising the use of a decoding algorithm to determine said second set of phase coefficients.

4. A method for optimizing a quantum circuit, expressed as a sequence of CNOT and $R_Z$ gates, wherein the circuit is first analyzed to obtain a set of phase coefficients and a linear permutation, and then the method of claim 1 is utilized to synthesize a new circuit.

5. The method of claim 4, wherein a Reed-Muller decoding method is utilized to determine an alternate set of phase coefficients minimizing the number of $R_Z$ gates required.

6. The method of claim 5, wherein the Reed-Muller decoder is used to decode the binary residue of the set of phase coefficients, the result of which is then used to generate the alternate set of phase coefficients.

7. The implementation of the method of claim 4 as a computer program, wherein a processor receives a quantum circuit expressed over CNOT and $R_Z$ gates in suitable digital form, and then produces an optimized circuit in suitable digital form performing the same function.

8. A non-transitory computer readable medium for synthesizing a new quantum circuit, the non-transitory computer readable medium comprising computer executable instructions according to the method of claim 4.

9. A computing system for optimizing a quantum circuit, comprising:
a memory device that stores a first digital form of an initial quantum circuit expressed as a sequence of CNOT and $R_Z$ gates;
a processor device that obtains and analyzes the first digital form to determine an ordered set or vector of phase coefficients and to specify a linear permutation;
the processor device determines a sequence of CNOT and $R_Z$ gates using the set of phase coefficients and the linear permutation, such that the number of $R_Z$ gates is reduced;
the processor device subsequently computes a second digital form of a new quantum circuit; and
the memory devices stores the second digital form.

10. A process of producing a quantum circuit, comprising:
obtaining a digital form of an initial n-qubit quantum circuit expressed over CNOT and $R_Z$ gates;
a computer analyzing the digital form of the initial quantum circuit to obtain a set of phase coefficients and a linear permutation;
the computer determining a sequence of CNOT and $R_Z$ gates using the set of phase coefficients and the linear permutation, and computing a digital form of a new n-qubit quantum circuit from the sequence having a reduced number of $R_Z$ gates compared to the initial quantum circuit, and the new quantum circuit performing the same function as the initial quantum circuit; and
executing physical CNOT and $R_Z$ transformations in a quantum computer in accordance with the digital form of the new quantum circuit.

11. A system of producing a quantum circuit, comprising:
a binary computer in data communication with a quantum computer;
the binary computer comprising a memory device that stores a digital form of an initial n-qubit quantum circuit expressed over CNOT and $R_Z$ gates;
the binary computer comprising a processor device to:
analyze the digital form of the initial quantum circuit to obtain a set of phase coefficients and a linear permutation;
determine a sequence of CNOT and $R_Z$ gates using the set of phase coefficients and the linear permutation, and compute a digital form of a new n-qubit quantum circuit from the sequence having a reduced number of $R_Z$ gates compared to the initial quantum circuit, and the new quantum circuit performing the same function as the initial quantum circuit;
the binary computer further comprising a communication device to transmit the digital form of the new quantum circuit to the quantum computer;
the quantum computer comprising a communication device to receive the digital form of the new quantum circuit; and
the quantum computer comprising devices to execute physical CNOT and $R_Z$ transformations in the quantum computer in accordance with the digital form of the new quantum circuit.

* * * * *